United States Patent [19]
Klein et al.

[11] Patent Number: 4,890,238
[45] Date of Patent: Dec. 26, 1989

[54] METHOD FOR PHYSICAL VLSI-CHIP DESIGN

[75] Inventors: Klaus Klein, Sindelfingen; Kurt Pollmann, Altdorf; Helmut Schettler, Dettenhausen; Uwe Schulz, Boeblingen; Otto M. Wagner, Altdorf; Rainer Zuehlke, Leonberg, all of Fed. Rep. of Germany

[73] Assignee: International Business Machines Corporation, Armonk, N.Y.

[21] Appl. No.: 133,402

[22] Filed: Dec. 15, 1987

[30] Foreign Application Priority Data

Dec. 17, 1986 [EP] European Pat. Off. ........ 86117601.4

[51] Int. Cl.⁴ .............................................. G06F 15/60
[52] U.S. Cl. ..................................... 364/491; 364/490; 364/489; 364/488
[58] Field of Search ............... 364/488, 489, 490, 491, 364/300

[56] References Cited

U.S. PATENT DOCUMENTS

| | | | |
|---|---|---|---|
| 4,577,276 | 3/1986 | Dunlop et al. | 364/488 |
| 4,593,363 | 6/1986 | Burstein et al. | 364/491 |
| 4,608,649 | 8/1986 | Dowis et al. | 364/491 |
| 4,612,618 | 9/1986 | Pryor et al. | 364/488 |
| 4,613,940 | 9/1986 | Shenton et al. | 364/491 |
| 4,630,219 | 12/1986 | DiGiacomo et al. | 364/491 |
| 4,713,773 | 12/1987 | Cooper et al. | 364/488 |

Primary Examiner—Parshotam S. Lall
Assistant Examiner—V. N. Trans
Attorney, Agent, or Firm—Mark F. Chadurjian

[57] ABSTRACT

For the physical design of a very large scale integration (VSLI) chip, a method is provided to implement a high density master image that contains logic and RAMs. In a hierarchical top-down design methodology, the circuitry to be contained on the chip is logically divided into partitions that are manageable by the present automatic design systems and programs. Global wiring connection lines are from the beginning included into the design of the different individual partitions and treated there in the same way as circuits in that area. Thus, the different partitions are designed in parallel. A floor plan is established that gives the different partitions a shape in such a way that they fit together without leaving any space between the different individual partitions. The chip need no extra space for global wiring and the partitions are immediately attached to each other. The master image described is very flexible with respect to logic, RAM, ROM and other macros, and it offers some of the advantages of semicustom gate arrays and custom macro design. The thus designed chip shows no global wiring avenues between the partitions and has partitions of different porosity.

6 Claims, 4 Drawing Sheets

METHOD FOR PHYSICAL VLSI-CHIP DESIGN

DESCRIPTION

1. Technical Field

This invention relates to a method for physical chip design, wherein the chip is divided into several partitions and contains a high number of electrical elements, as, for example gates, pins, and connections, and wherein connections exist between those partitions, and to a chip designed in accordance with this method.

2. Background Art

In IBM Technical Disclosure Bulletin Vol. 27, No. 8, Jan. 1985, page 4648–4651 there is described a method for functional partitioning of a large, dense VLSI (Very Large-Scale Integration) chip. Described is the physical partitioning of logical functions in the VLSI chip design to keep the wire length of the interconnections between the different partitions as short as possible. This article describes especially an algorithm for hierarchically dividing a logical function into more primitive logic functions that are subordinated to the higher one.

A further article in IBM Technical Disclosure Bulletin Vol. 27, No. 11, Apr. 1985, pages 6687–6691 shows, that a single chip might be partitioned into regions with different logical functions, for example, elements such as RAM (Random Access Memory) and ROS (Read Only Storage) partitions of PLA's (Programmable Logic Arrays) and other functional partitions. Between those different partitions buses for signal interconnections and power supplies are provided.

In an article "Channel Assignment for Chip Wiring" in IBM Technical Disclosure Bulletin Vol. 26, No. 3A, Aug. 1983, pages 934–936 the problem of routing global wires between different partitions of a chip is shown. The article says that a general strategy for the wiring of chips is to solve the problem within phases: a global assignment of wires is made to specific channels; next, the particular channel tracks for individual wires are chosen and interconnections are established to specified pins of the macros within the chip. A macro essentially can be considered to be a kind of a functional partition.

The problem with presently designed logic and micro-processor chips is that they contain logic circuits in the range of up to 35000. This huge amount of circuits causes very severe problems during the physical design of the chip. The data volume is by far to high to be handled by the available placement, wiring and checking programs running on a large main frame computer.

One possible way of at least improving this problem might be to use a system architecture with extended memory address capability. But even if the data volume problem is manageable by this architecture, there is still the problem of the run time. That means that the whole execution may be longer than the meantime between failures. Therefore, besides the question that the methodology has not been proved yet, there is the increasing need for run time.

Another principle way of approaching this problem is to partition the whole design complex, performing the design in parallel for so-called macros and then using extra space between the macros for global wiring. That means on the other hand that the chip size gets larger and that the wire length of the global wires becomes longer. Longer wires have a direct impact on the performance of the chip and the power dissipation.

DISCLOSURE OF THE INVENTION

It is a principle object of this invention to provide a way and a methodology for physically designing a VLSI chip by which the overall chip density can significantly be improved and at the same time the data volume can be handled by existing computers and design programs.

It is also an object of the present invention to provide a method wherein extra space between partitions for global wiring is avoided.

Furthermore, it is an object of this invention to provide a method that achieves logic circuit densities which compare favorably with those of custom designed chips.

The method in accordance with this invention provides in an advantageous manner a hierarchical physical design methodology in a top-down way. The complete logic circuitry is partitioned logically into pieces that are manageable by computer programs and by computers. Those partitions are selected such that the interconnections between them are minimized. The areas of the partitions are shaped such that they fit together without leaving empty space in between. So, by floor-planning, no dedicated area is assigned for global wiring. A partition is a self-contained piece of logic, i.e., all connections needed to interconnect neighboring partitions are included in the partition. That means that one partition may contain wires that emerge, wires that end and wires that cross the partition. All those wires and connections are treated in the same way. For that purpose the connections between the partitions are made by field connectors from transfer books which provide the necessary contacts. Those transfer books then cooperate with associated transfer books of the neighboring partitions. In other words, formal transfer circuits without a logic function are introduced. Their pins define the input/output positions at the partition boundary. Those transfer circuits then cooperate with associated transfer circuits of the neighboring partitions. The transfer circuits act as a connector, which connects the global wires between adjacent partitions. During partition wiring all wires are treated simultaneously in the same way.

Further in accordance with the method of this invention, in an advantageous manner of a further development, the internal layout of the individual partition is performed independently of the layout and design of the other partitions after pin determination of each partition has been performed.

This also means, that in an advantageous manner in accordance with the present invention, each partition, in a way forming a subchip, can be designed independently from the other partitions and in portions parallel to them. As result, placement and wiring programs have only to deal with data volumes that are comparable to those associated with today's single LSI chips or single macros, respectively. This is done regardless of the size and complexity of the complete VLSI chip. The detailed design of each partition accommodates all the chip features or partition features, respectively, within its boundaries, for example, powergrid and blockages. After all partitions have been designed, they are then assembled simply by abutting them at their boundaries. Then only at the outer perimeter of the assembled chip, that means the compiled partitions, outer pins connect the chip to its substrate carrier.

A further advantage of the method in accordance with this invention is that the complete method is interactive and permits a designer to do the physical design of a complex chip within a reasonable amount of time. The logic circuit density achieved compares favorably with those of custom designed chips, while the application of automated design methodologies reduces the design time.

The foregoing and other objects, features and advantages of the invention will be apparent from the following more particular description of preferred embodiments of the invention, as illustrated in the accompanying drawings.

BEST MODE FOR CARRYING OUT THE INVENTION

The physical design process covers the placement and interconnection of all logic gates and custom macros, as well as the generation of shapes data for the production masks. The design method consists of a combination of highly automated interactive and background steps. Depending on the density and performance requirements, it allows a variety of procedures from a fast walk through to a rather extensive method with reiterative steps in order to achieve the objects and goals.

In accordance with the invention, a hierarchical top-down methodology is implemented for the physical design which solves the data volume problem and limits the resource requirements for computer time and storage requirements tremendously. Actually the exponential growth of computer time is limited to the amount that is required for the largest partition. From there it is a linear growth depending on the number of partitions. The storage requirement is also limited to the size that is required for the largest partition.

Figure 1:
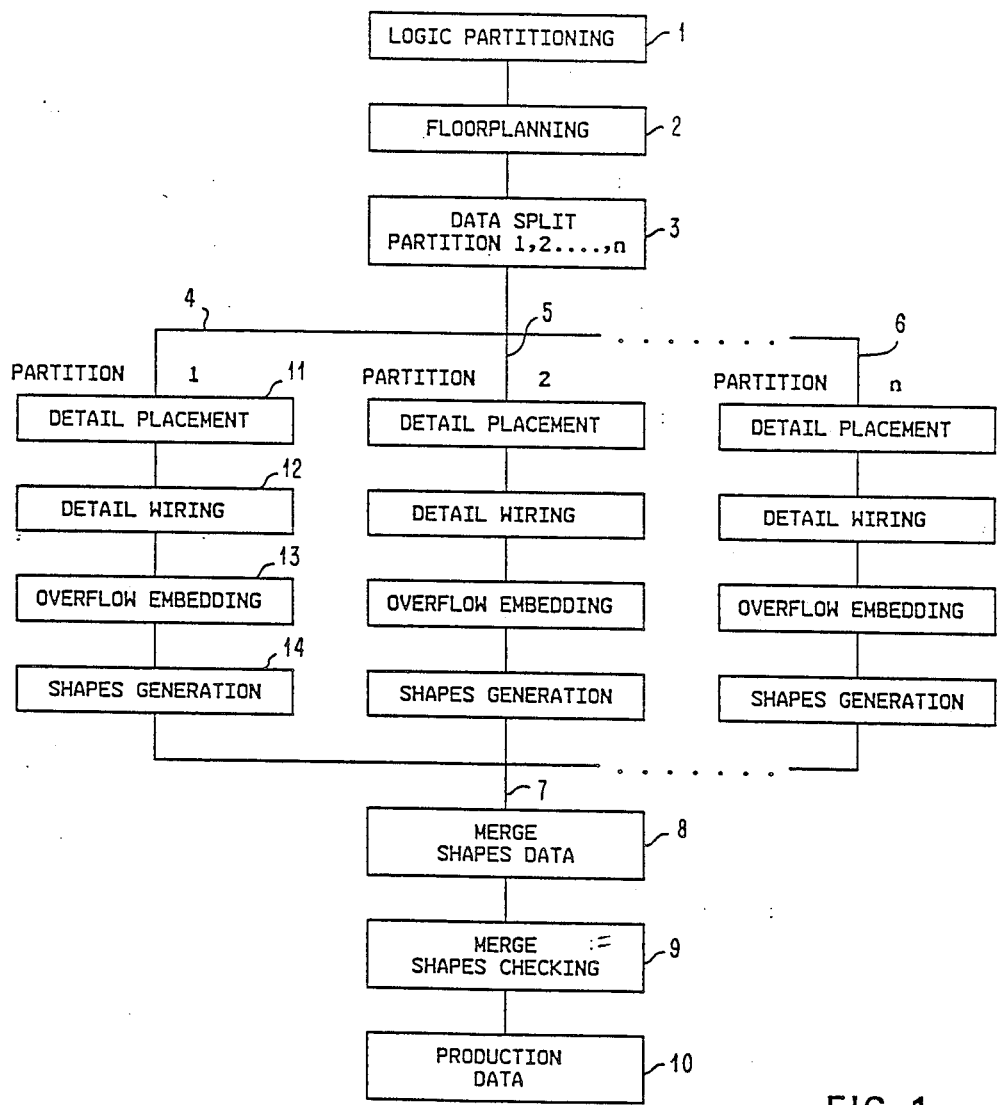
FIG. 1 is a schematic flow chart showing the essential steps of the method in accordance with the present invention.

Referring more specifically to the drawings, FIG. 1 indicates the overall flow in subsequent steps of the total physical design method. In step 1, the total design circuitry is divided by logic partitioning into separate partitions. In step 2, a floor planning step transfers the logic partitions into physical partitions generating real size and offset coordinates for each partition. After floor planning is completed, the data is separated to form single partitions 1, 2, . . ., n in step 3.

In parallel branches of which branches 4, 5 and 6 are shown, the partition 1, partition 2 and partition n are designed in parallel. As shown with branch 7, the results come together in a step 8 for merging the shapes data. In step 9, the shapes are checked and, in step 10, production data for the masks are generated.

Figure 2A:
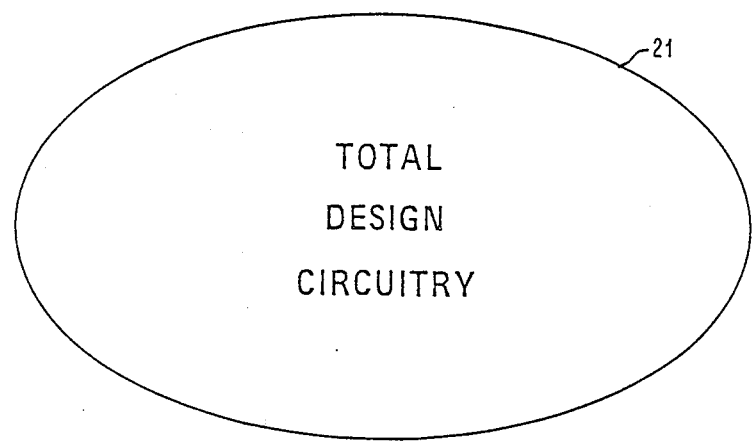
FIGS. 2A and 2B show in principle how the total design circuitry is logically divided into separate partitions.
Figure 2B:
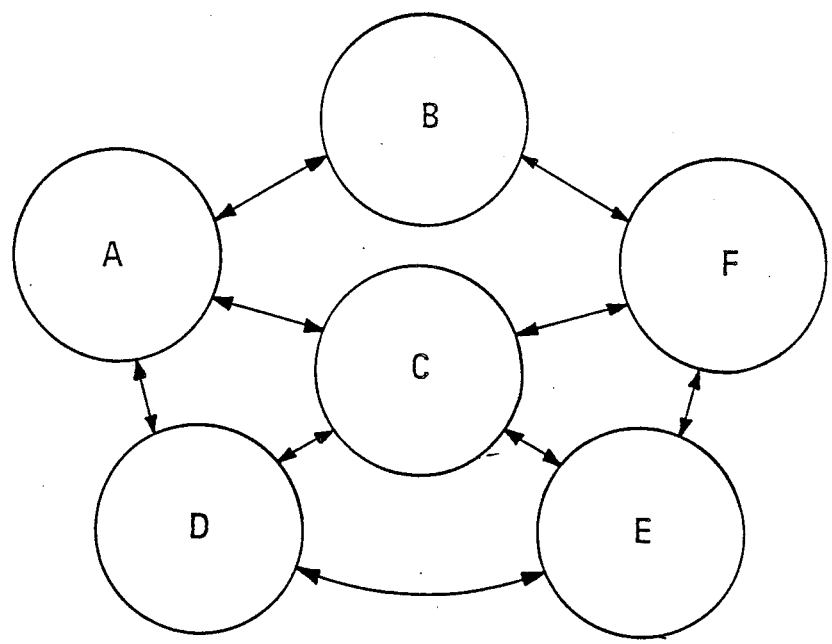

FIGS. 2A and 2B indicate in more detail the logic partitioning as identified by step 1 in FIG. 1. The total design circuitry 21, as shown in FIG. 2A, is partitioned, for example, into segments or partitions, respectively, A, B, C, D, E, F. Those partitions may contain 3000–6000 logic gates. The logic partitioning is performed to form the segments such that the number of connections between the different functional islands or segments A to F is minimized. That means, the resulting logic partitions have a minimum number of connections running from one partition to the other partitions, those connections are indicated by double arrows in FIG. 2B. Such partitions then have a defined number of inputs/outputs and meet the maximum partition limits.

Figure 3:
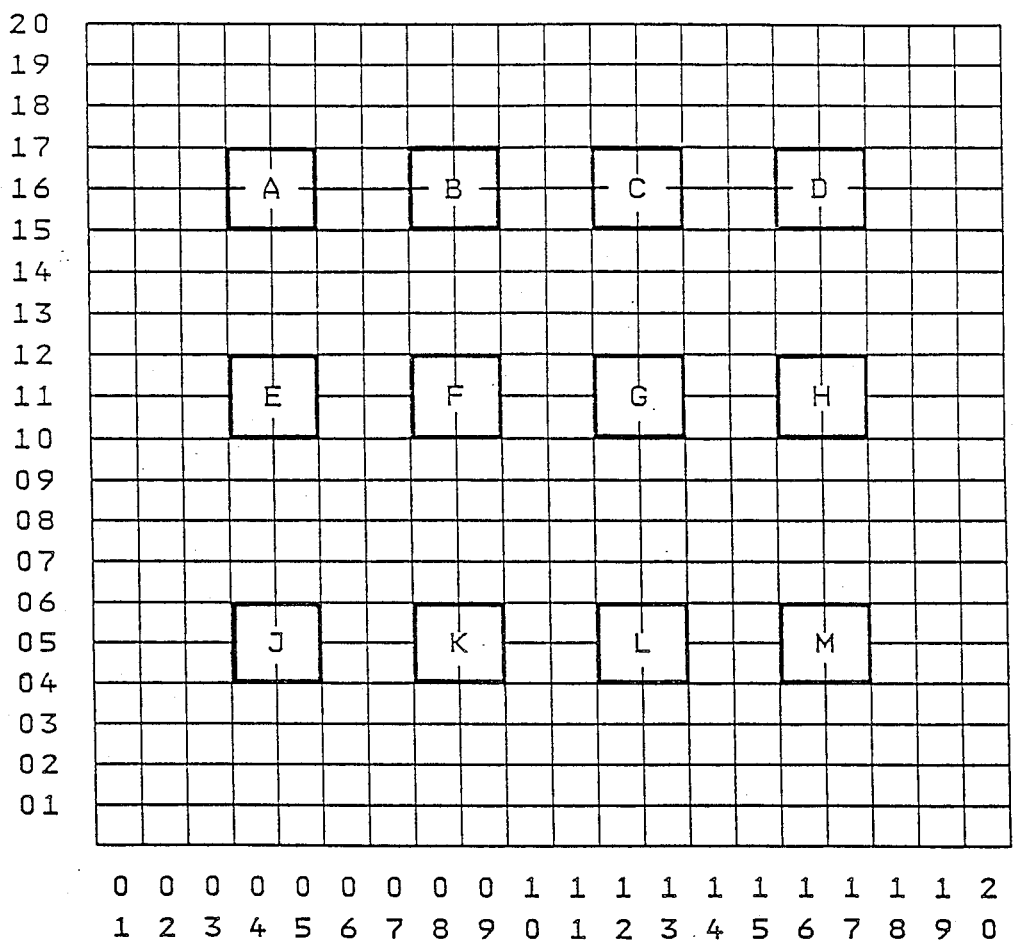
FIG. 3 shows schematically a floor planning matrix.
Figure 4:
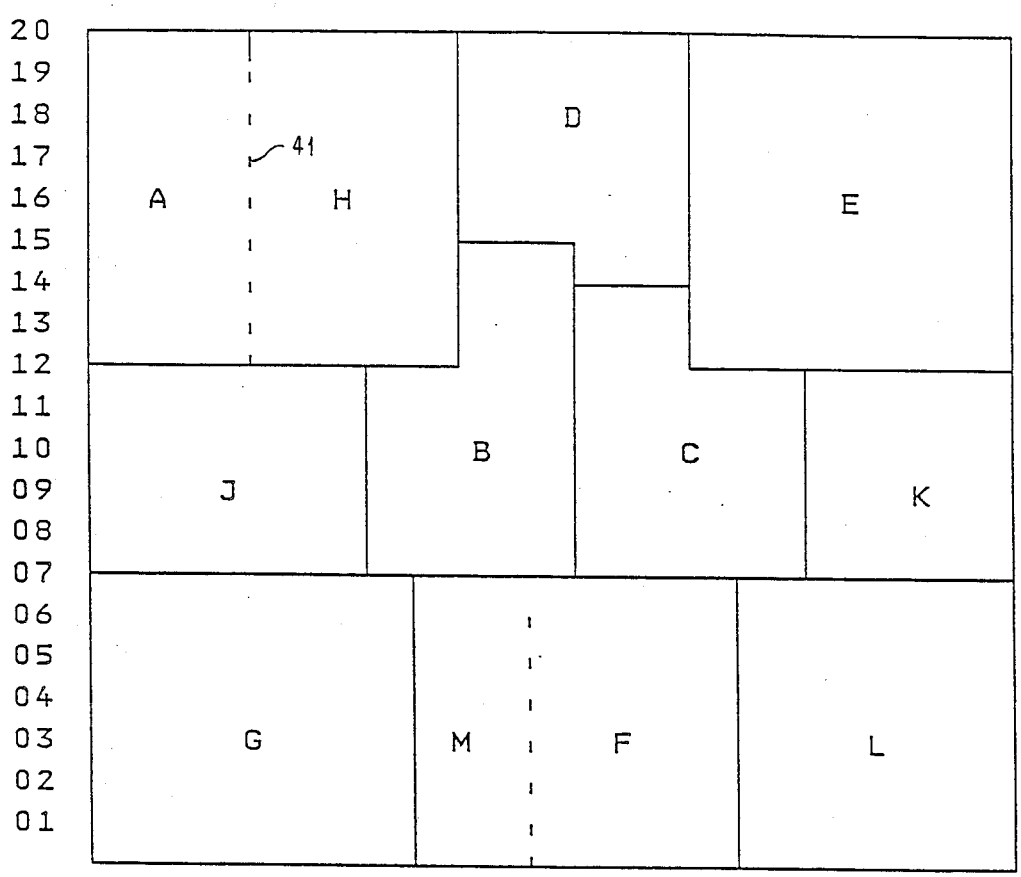
FIG. 4 shows an example of the result of a floor plan.

With regard to FIG. 3 and FIG. 4, the floor planning step 2 (see FIG. 1) is described in more detail. A floor planning matrix is shown with 400 positions. Within those 400 positions, for example, the twelve shown partitions A–M have to be placed. That means that the logic partitions A–M (see the functional islands shown in FIG. 2B as an example) have to be transferred into physical partitions. In the floorplanning step the best partition arrangement in relative positions to each other is sought. That means in other words that in this step the real size and the offset coordinates of each partition within the available chip area are generated. In addition to that it should be noted that access to the periphery I/0 circuits and all required signal interconnections to other partitions is given. The partition areas are defined in a way that they fit together seamless like pieces of a puzzle. No extra space for global wiring is defined in the resulting floorplan nor intended to.

To overcome the need for global wiring routing avenues running around the different partitions, all required interconnections between the different partitions do run as feed-through-connections through the different partitions from one partition to the partition to which they should be run. Internally in each partition those global wires crossing the boundaries are handled as if they where parts of this partition. That means that beside ending and emerging lines from a partition also the crossing lines are treated equally with circuits in that area. As a result the global wires are routed straight through the partitions, thus allowing the shortest possible connection length. That on the other hand means that within a partition the internal circuits are arranged more to the edges of the partition and the feed-through-connections lines run through the middle of the partition. That also means that some areas of a partition are packed denser than others and no equal density is given. By choosing the porosity of an area in accordance with necessity, a very flexible design is provided.

FIG. 4 shows a result of the physical floor planning. It shows the puzzle-like and seamless putting together of the different partitions A–M.

To allow subsequent processing in a physical design using standard design automation programs, for each partition, transfer circuits are added to the logic structure of each partition. The pins of these transfer circuits represent just wiring channel crosspoints at the partition boundaries. This means each signal or wire entering or leaving a partition gets at least one of those transfer circuits. For example, a horizontal feed-through-connection is represented by just two transfer circuits, one at the right side and one at the left side of the partition. Within the automatic wiring procedure, the corresponding transfer circuits (left to right) are connected. The resulting wire forms a feed-through-connection.

A partition must keep all its circuits and all wires inside the area for this partition. A formal circuit without logic function is introduced. It is placed all around the partition area and blocks all wiring channels within its occupied area. So during physical design of the partition all circuits and wires are forced to stay inside the partition area.

It should be noted that from the beginning global wires crossing a partition are treated in the same way as circuits on that specific partition and are considered as a part of this partition.

After having completed the floorplanning, the data is separated in order to form single partitions. Each of these partitions is then processed like a separate chip through physical design programs. As shown in branch 4 of FIG. 1, there is a step 11 for detail placement of the first partition. The phase of detail placement is optimized to meet the requirements of the subsequent wiring phase. These requirements mainly are a homogeneous distribution of points to be wired over the full partition area and to supply a sufficient number of free wiring channels for feed-through-connections.

During the detail placement step 11 within each partition the following placement targets are important: the overall wiring length has to be minimized and any clustering has to be avoided. An even distribution of wiring points and a balanced center and edge density is aimed at. Furthermore, space has to be provided for bus structures as well as for feed-throughs, that means crossing lines. Also the critical net capability has to be obeyed.

As the floor planning process of step 2 takes care of all required connections, the space allocation for each partition has been adjusted accordingly in order to allow the placement to reach this objective. As a result the partitions located near the chip center will have a lower circuit density than partitions located near the chip periphery. During the floor planning step 2 the space calculation in accordance with known values is important. Critical points are the number of circuits, the density factor and the numbers of connections. Furthermore, the population factor at the center and at the edge of a partition and especially the feed-through-connections must be considered.

After the first partition 1 is processed through placement, in the detail placement step 1, the next adjacent partition, for example, partition 2 in FIG. 1 or, considering the floor planning result of FIG. 4, partition H adjacent to partition A, can be started with detail placement. The only difference to the first partition A is the transfer circuits located on their common boundary, that means at the line 41 must be processed as preplaced for the second partition now. Exits on line 41 from partition A are inputs to partition H. That means that a partially overlapped processing for all partitions is possible.

After detail placement, a step 12 in FIG. 1 provides the detail wiring for each partition. A standard chip wiring program is used to automatically complete the connection of all circuits, transfer circuits and transfer books, as well as embedded macros as usual.

In the detail wiring step 12 during which circuits within each partition have to be connected, the overall wiring length has to be minimized. Furthermore, even wiring channel usage is sought after. The number of overflows should be minimized and an easy embedding should be aimed at.

For very dense parts, a small number of connections may be left as overflows. In this case an interactive tool is used to complete the remaining connection at the screen in the overflow embedding step 13.

In step 14, the shapes generation for each partition can be performed. This is done after detail wiring is completed and final checks are successfully processed. Then, in the shape generation step 14, the shapes for the production masks are generated.

As shown in step 8 of FIG. 1, branch 7 combines the shapes data of the different partitions. In a final merge run, the shapes data of all partitions are collected and put together. Each partition has its own XY offset according to the floor plan. On the boundaries of the partitions the transfer books of adjacent partitions are overlaid. Because these transfer books represent wiring channel cross points, the wiring pieces of the puzzle snap together and complete nets are formed matching the overall logic structure.

In step 9, an extensive final checking is performed on the merged shape data. This completes the physical design process. In this checking the partition data are checked against the total image data. In addition, especially the connection data for signals crossing partition boundaries are checked for completeness and the partition boundaries are checked for overlap conflicts. Finally out of these checked data, the production data are generated in step 10.

The method in accordance with the present invention is very flexible with respect to logic, RAM, ROM and other macros. It describes a master image. Macros of any size can be placed at any location on the chip. The method was implemented with a technology using for the master image a 1.0 $\mu$m CMOS N-Well structure with three layers of metal. Two layers are used for wiring and the third layer contains a power distribution and I/0 redistribution for the central area pad arrangement.

The master image is an array of cell locations without gates or transistors. The virtual cell grid is subdivided in a finer grid marking the vertical and horizontal wiring channels. The cell size might be, for example, 13.8 $\mu$m $\times$ 89 $\mu$m. This basic cell contains at most three pairs of transistors and provides 25 wiring channels on the 1st level and three channels on the 2nd level metal. Two channels on the 1st level may be blocked by powerlines. To meet all ground rule restrictions imposed by any wiring and via combination, the circuit layouts have to harmonize with the wiring grid. This is achieved by placing sub-circuit elements on the same grid and connect the pieces with standard wires of polysilicon, 1st and 2nd metal. A logic circuit blocks 3–5 channels on 1st level metal by its internal connections. During personalization, the logic circuits, represented by books, and the larger macros which might be custom designed, are placed and wired by the automatic design system. A single circuit represented by a book may take the area of one or more cells. Macros like RAM's are custom designed parts with an optimized layout.

The used master image in accordance with the present invention is suitable for circuit depopulation achieved by the placement strategy. During the placement procedures the chip areas showing a congestion of global interconnections are identified. They are depopulated by moving the circuits towards the peripheries of these areas. Empty cells in the center yield the required routing channels. Thus, a uniform and, therefore, optimal usage of the wiring channels is achieved. It also means that the offering of a considerable amount of about 30% more cells than actually can be used was done purposely in order to allow the depopulation. The power buses are distributed on special, somewhat wider channels forming a low inductive grid on 1st and 2nd level metal. They are contacted frequently to the 3rd level metal buses. The supply current is flowing mainly through these wide and, therefore, low ohmic and low inductive distribution nets on the 3rd level metal rather than through 1st and 2nd metal. The power buses on first and second metal can be cut out anywhere for embedding macros of any size. The macros provide their own local power distribution which is connected directly to the 3rd level metal.

The method in accordance with the present invention for the physical design of the master images for VLSI chips combines the advantage of gate arrays and full custom designs. This method is very flexible for integration of logic books, RAM, ROS and other macros. Different areas of the chip can be designed in parallel, thus, reducing the necessary computer time and computer storage requirements. As wiring connections between the different areas or partitions of the chip are included in the design of the individual partitions, the resulting chip needs no extra space for global wiring. Thus, a chip results with seamless attached and separately designed areas. Design changes in the individual partitions can be performed easily and without impacting the rest of the design.

While the invention has been particularly shown and described with reference to preferred embodiments thereof, it will be understood by those skilled in the art that various changes in form and details may be made therein without departing from the spirit and scope of the invention.

What is claimed is:

1. A method for the physical design of a chip, said chip being divided into several partitions and containing a high number of electrical circuits wherein connections exist between partitions, which method includes the steps of logically dividing into partitions the circuits to be placed on said chip, determining space requirements of said partitions and placing said partitions onto different areas of said chip, determining logic as well as crossing, ending and emerging connection lines within a given partition by treating connection lines within said given partition in the same way as circuits therein, and repeating this step sequentially for adjacent partitions until all partitions have been processed, at least some of said processed partitions having circuit densities that differ from others of said processed partitions, shaping the processed partitions into various shapes so that they fit to each other without leaving space in between the neighboring edges of said adjacent partitions, determining interconnect contact points at the boundaries of said partitions by starting in one specific area of the chip and propagating step-by-step in a given direction to form exit information and contact areas of one of said partitions as the input information or placement respectively for the successive adjacent partition or partitions respectively, and abutting on said chip the appropriately shaped partitions so that each of said partitions is positioned seamlessly to another of said partitions.

2. A method for the physical design of a semiconductor chip, said chip being divided into several partitions and containing a high number of electrical circuits wherein connections exist between said partitions, which method includes the steps of logically dividing in several partitions all circuits to be contained on the chip, establishing a floor plan that reflects space requirements as well as locations of said partitions, said partitions being completely processed independently and in parallel by treating the interconnection lines that cross, emerge or end in a given partition the same as the internal circuits, physically defining said partitions so that at least one of said partitions have a shape that is different from that of the other of said partitions, such that on the spatial area of the chip said partitions fit together at adjacent edges without leaving space in between, and such that associated inter-connect-points match each other, and determining interconnect contact points at the boundaries of said partitions by starting in one specific area of said chip and propagating step-by-step in a given direction to form exit information and contact areas of one of said partitions as the input information or placement respectively for the successive adjacent partition or partitions respectively.

3. A method as set forth in claim 2 further including adjusting and varying the density or porosity respectively of partitions or regions.

4. A method as set forth in claim 2 further including forming the density of crossing interconnection lines in the middle of a region/partition higher than in the outer areas of that respective region/partition and forming the density of circuits in the outer areas of that respective region/partition higher than in the middle thereof.

5. A method as set forth in claim 2 further including establishing transfer books with logical functions, provided by electrical circuits, as well as transfer books with non-logical functions, provided by connection and transfer wires, both sort of books being disposed adjacent at the perimeter of its respective partition and defining the boundary interconnect-contact areas.

6. A method as set forth in claim 5 further including assigning formal blockage circuits to blockage areas, said blockage circuits having formal functions, and existing during processing for design purposes and being removable in the final design stage and final chip data.

* * * * *